(12) United States Patent
Raghunathan

(10) Patent No.: US 10,601,973 B1
(45) Date of Patent: Mar. 24, 2020

(54) MULTIPLE CONNECTOR ELECTRONICS DOCKING DEVICE

(71) Applicant: Balaji Raghunathan, Foothill Ranch, CA (US)

(72) Inventor: Balaji Raghunathan, Foothill Ranch, CA (US)

(*) Notice: Subject to any disclaimer, the term of this patent is extended or adjusted under 35 U.S.C. 154(b) by 0 days.

(21) Appl. No.: 16/358,365

(22) Filed: Mar. 19, 2019

(51) Int. Cl.
*H04B 1/38* (2015.01)
*H04M 1/04* (2006.01)
*H01R 27/00* (2006.01)
*H01R 39/64* (2006.01)
*H05K 5/02* (2006.01)
*F21V 33/00* (2006.01)
*H05K 5/03* (2006.01)
*H02J 7/02* (2016.01)
*F21Y 115/10* (2016.01)

(52) U.S. Cl.
CPC .......... *H04M 1/04* (2013.01); *F21V 33/0056* (2013.01); *H01R 27/00* (2013.01); *H01R 39/64* (2013.01); *H02J 7/025* (2013.01); *H05K 5/0217* (2013.01); *H05K 5/0247* (2013.01); *H05K 5/03* (2013.01); *F21Y 2115/10* (2016.08)

(58) Field of Classification Search
CPC ..... H04W 88/02; H04M 1/04; H04M 1/0214; H04M 1/72519; H04M 1/72522; H04M 19/08; H04M 2250/12
USPC .................................... 455/573, 550.1, 90.3
See application file for complete search history.

(56) References Cited

U.S. PATENT DOCUMENTS

| | | | |
|---|---|---|---|
| 7,689,197 B2* | 3/2010 | Laude | G11B 17/0405 181/198 |
| 7,966,723 B2 | 6/2011 | Basham et al. | |
| 8,068,336 B2 | 11/2011 | Crooijmans et al. | |
| 2005/0055487 A1 | 3/2005 | Tanaka et al. | |
| 2007/0026694 A1 | 2/2007 | Mayer | |
| 2007/0135157 A1 | 6/2007 | Kuo et al. | |
| 2012/0014056 A1 | 1/2012 | Chen et al. | |
| 2013/0058036 A1 | 3/2013 | Holzer et al. | |
| 2014/0097793 A1 | 4/2014 | Wurtz et al. | |
| 2015/0263565 A1* | 9/2015 | Amano | H02J 7/025 320/108 |
| 2016/0380461 A1* | 12/2016 | Jones | H02J 4/00 307/20 |

* cited by examiner

*Primary Examiner* — Temica M Beamer

(57) ABSTRACT

A multiple connector electronics docking device provides a selectable connector on a docking base. The device includes a housing configured for positioning on a support surface. A disc is coupled to the housing and rotatable relative to the housing. Portions of an upper face and a perimeter edge of the disc are exposed on the housing. The disc is rotatable relative to the housing by manipulation of the perimeter edge to expose a selectable portion of the upper face of the disc. Base connectors are spaced on the disc such that a selectable one of the base connectors is positionable to be exposed outside of the housing. A wire connects each base connector electrically to a power source.

16 Claims, 9 Drawing Sheets

MULTIPLE CONNECTOR ELECTRONICS DOCKING DEVICE

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to electronics charging devices and more particularly pertains to a new electronics charging device for providing a selectable connector on a docking base.

(2) Description of Related Art Including Information Disclosed Under 37 CFR 1.97 and 1.98

The prior art relates to electronics charging devices.

BRIEF SUMMARY OF THE INVENTION

An embodiment of the disclosure meets the needs presented above by generally comprising a housing configured for positioning on a support surface. A disc is coupled to the housing and rotatable relative to the housing. Portions of an upper face and a perimeter edge of the disc are exposed on the housing. The disc is rotatable relative to the housing by manipulation of the perimeter edge to expose a selectable portion of the upper face of the disc. Base connectors are spaced on the disc such that a selectable one of the base connectors is positionable to be exposed outside of the housing. A wire connects each base connector electrically to a power source.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
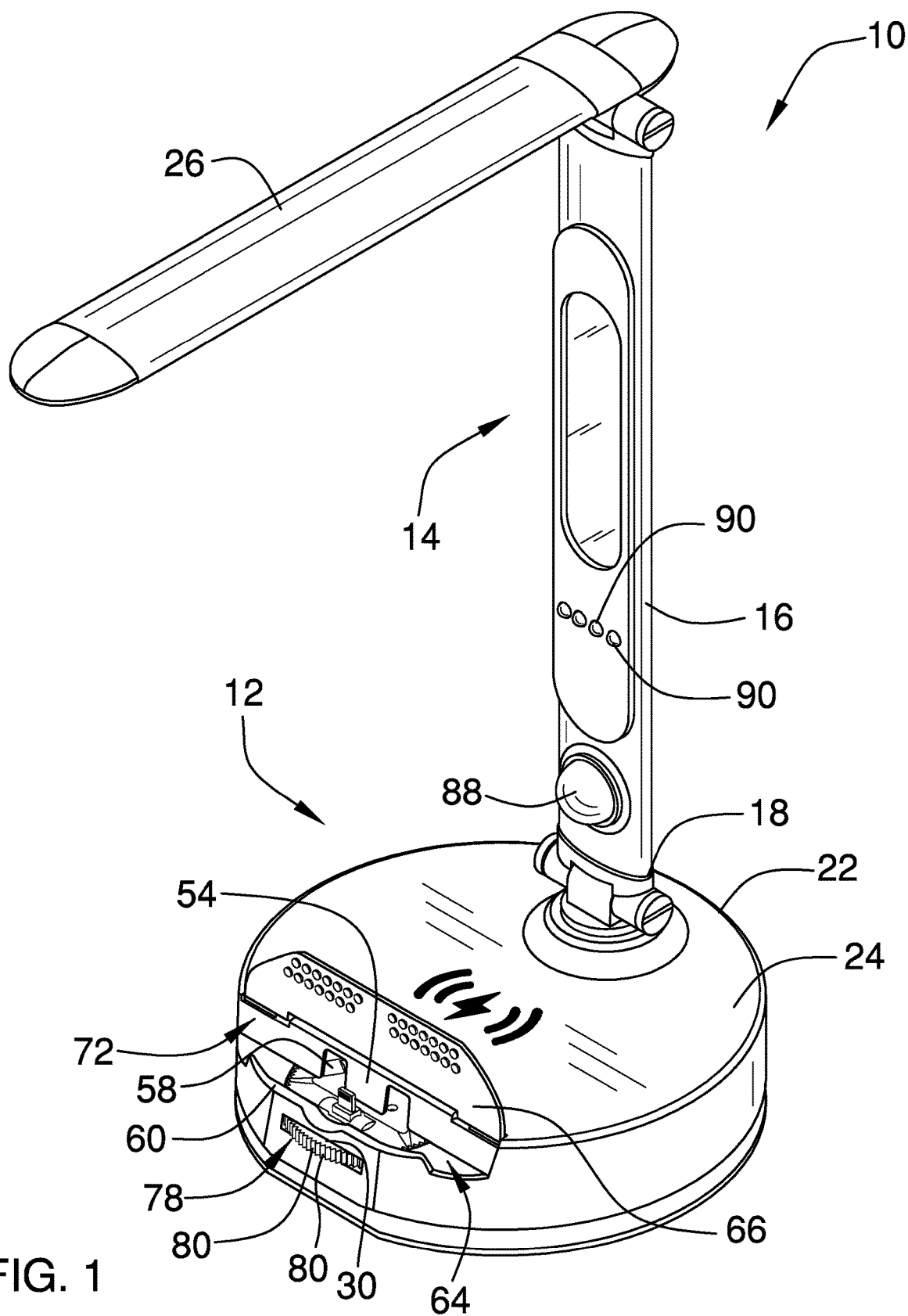
FIG. 1 is a top front side perspective view of a multiple connector electronics docking device according to an embodiment of the disclosure.
Figure 2:
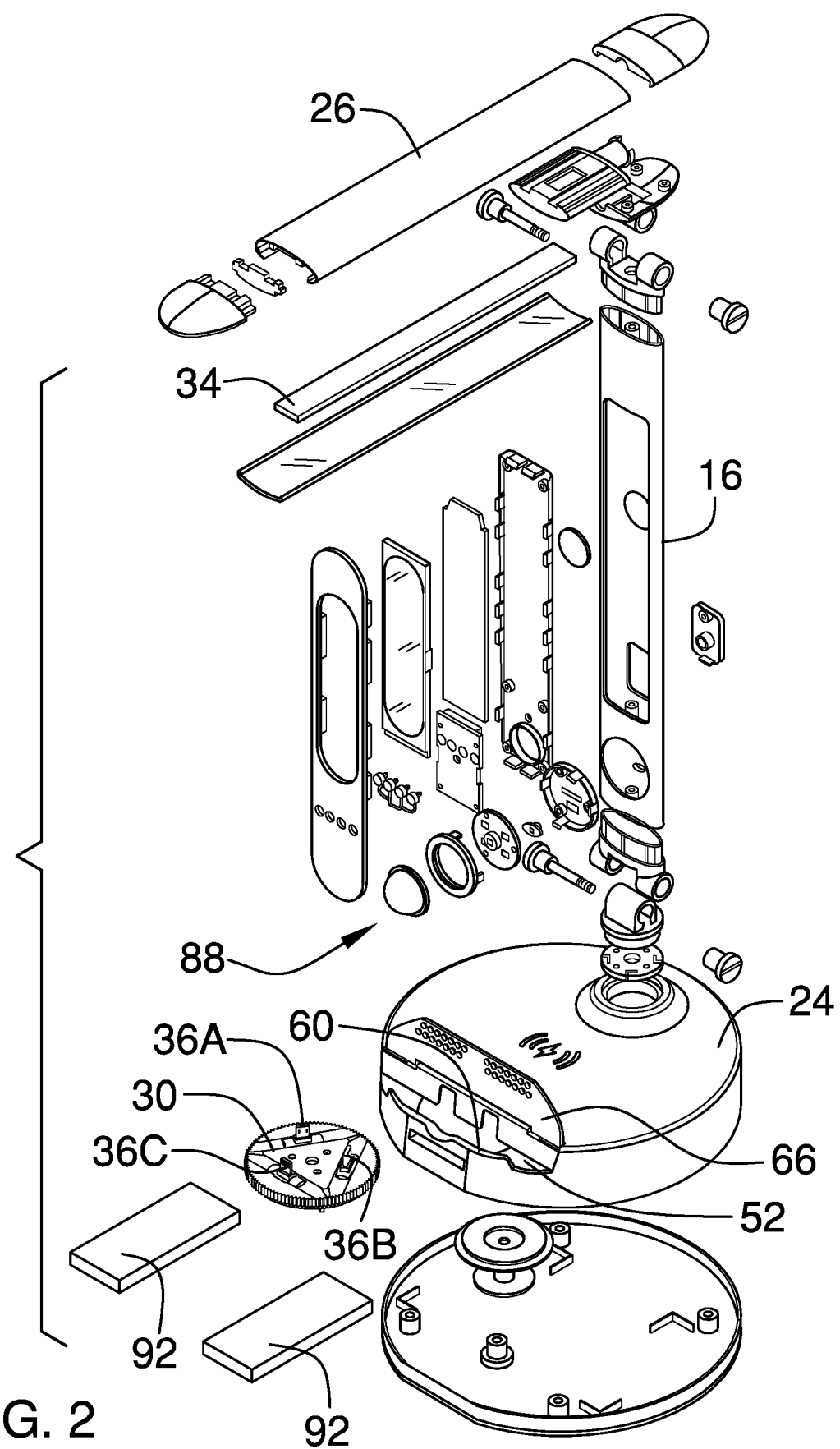
FIG. 2 is an exploded top front side perspective view of an embodiment of the disclosure.
Figure 3:
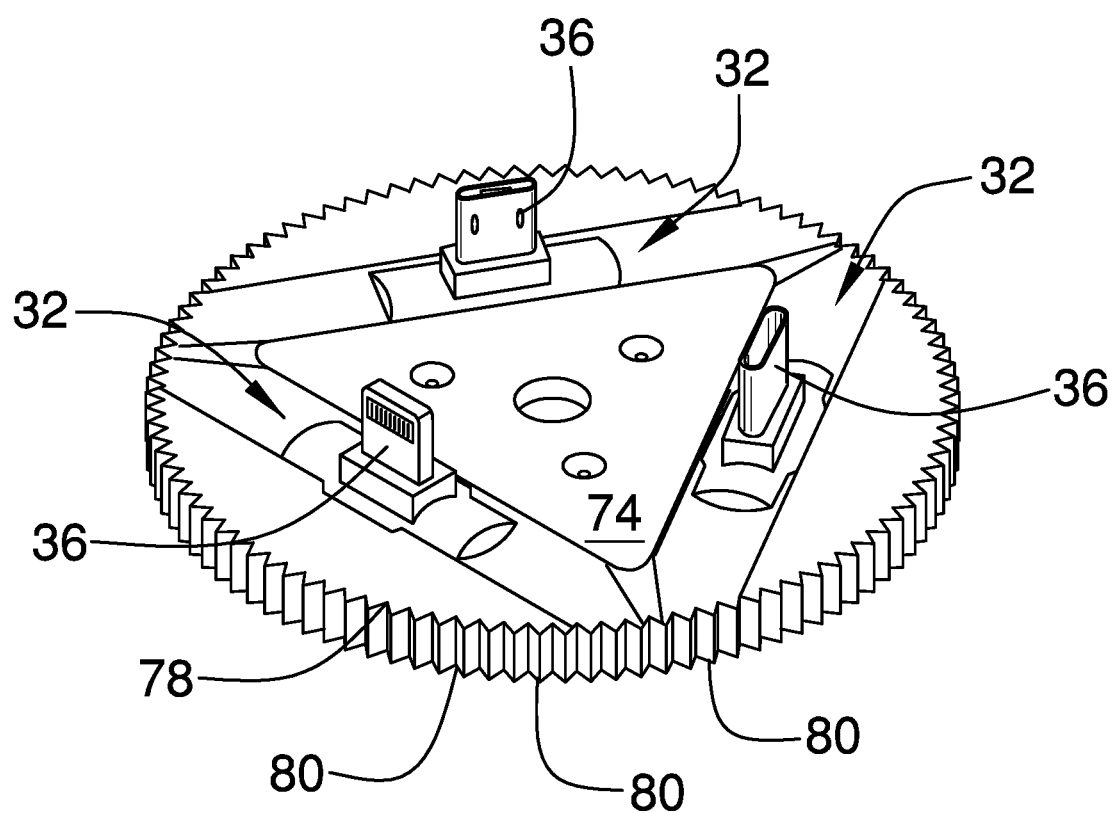
FIG. 3 is a top front side perspective view of a disc of an embodiment of the disclosure.
Figure 4:
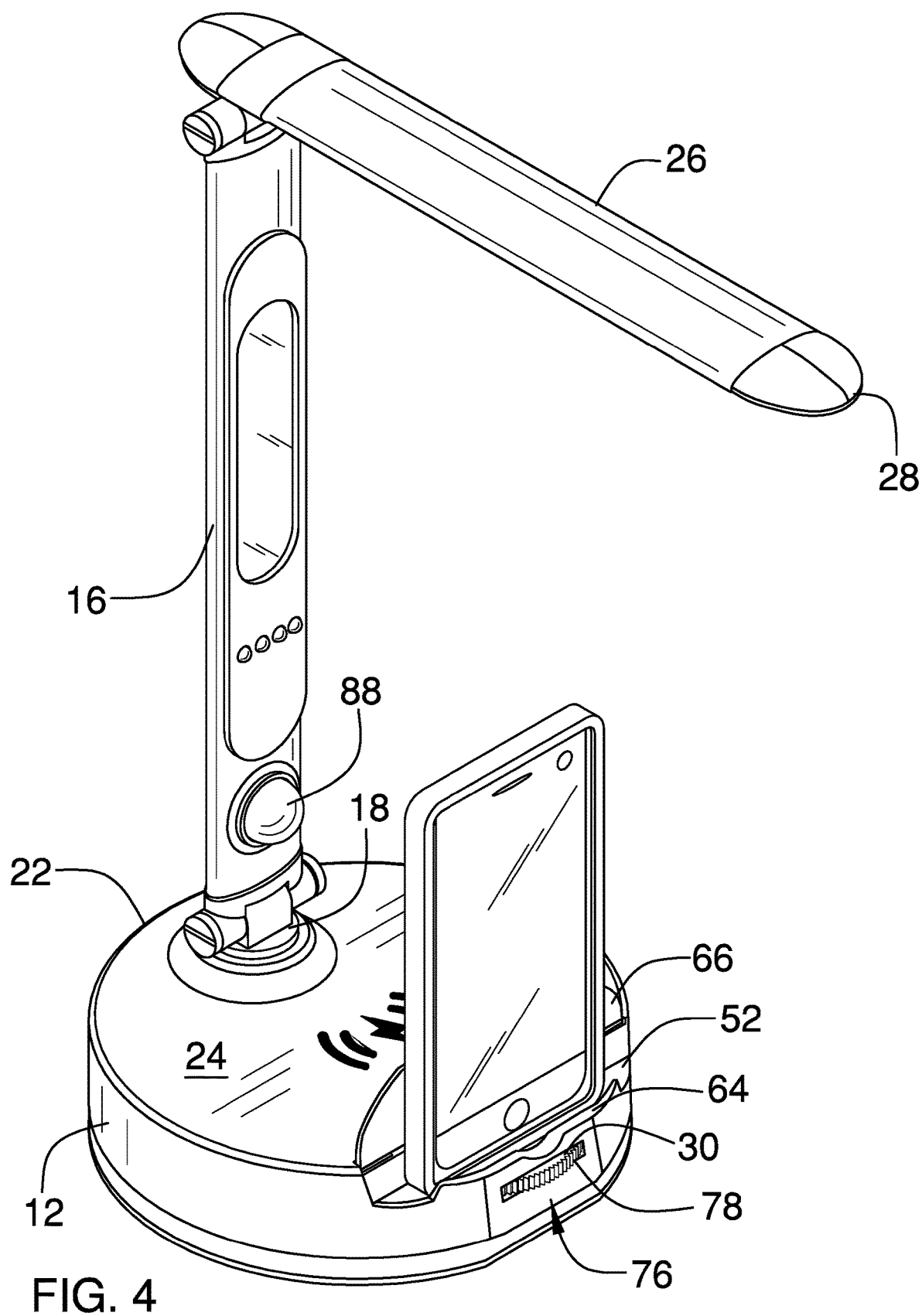
FIG. 4 is a top front side perspective view of an embodiment of the disclosure in use.
Figure 5:
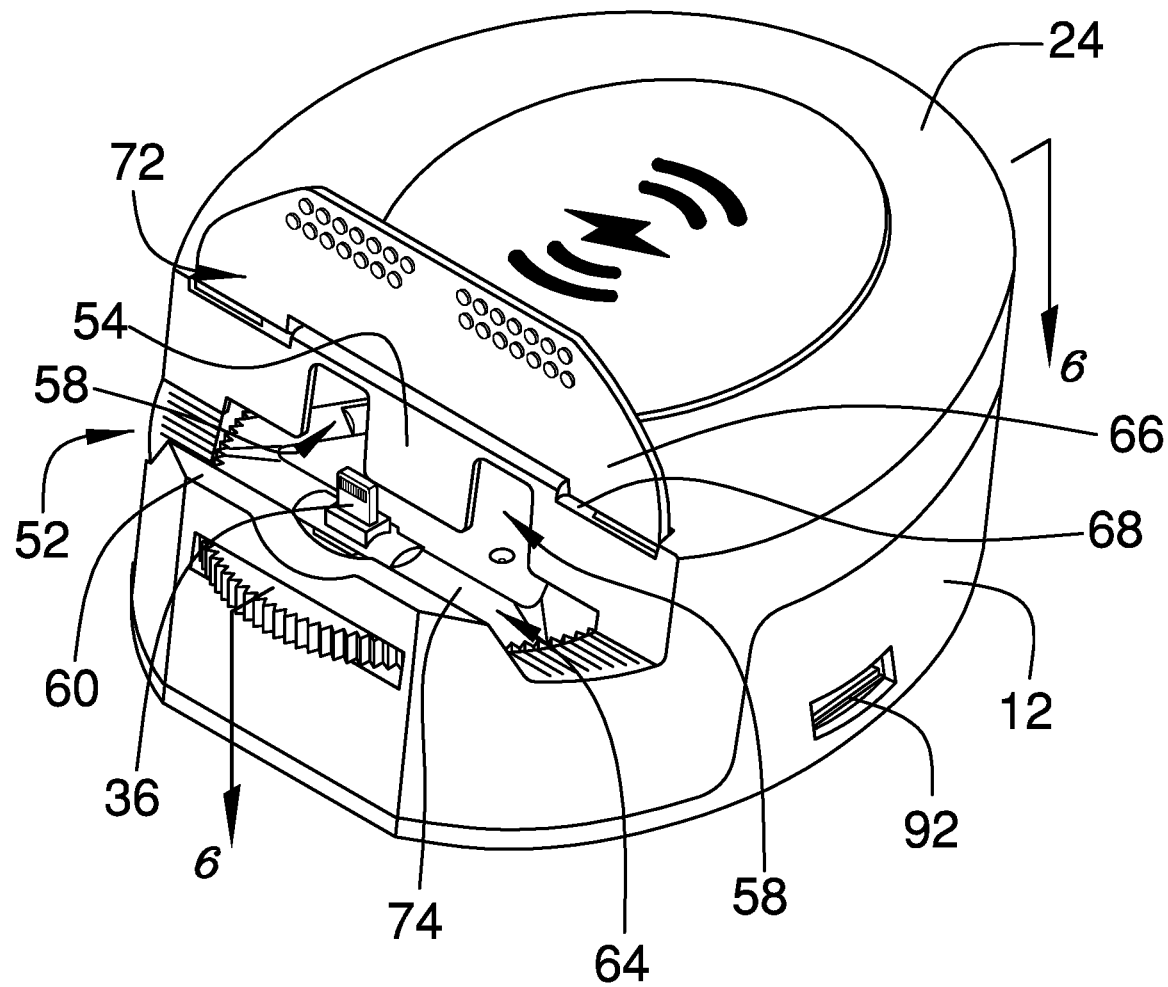
FIG. 5 is a top front side perspective view of an embodiment of the disclosure.
Figure 6:
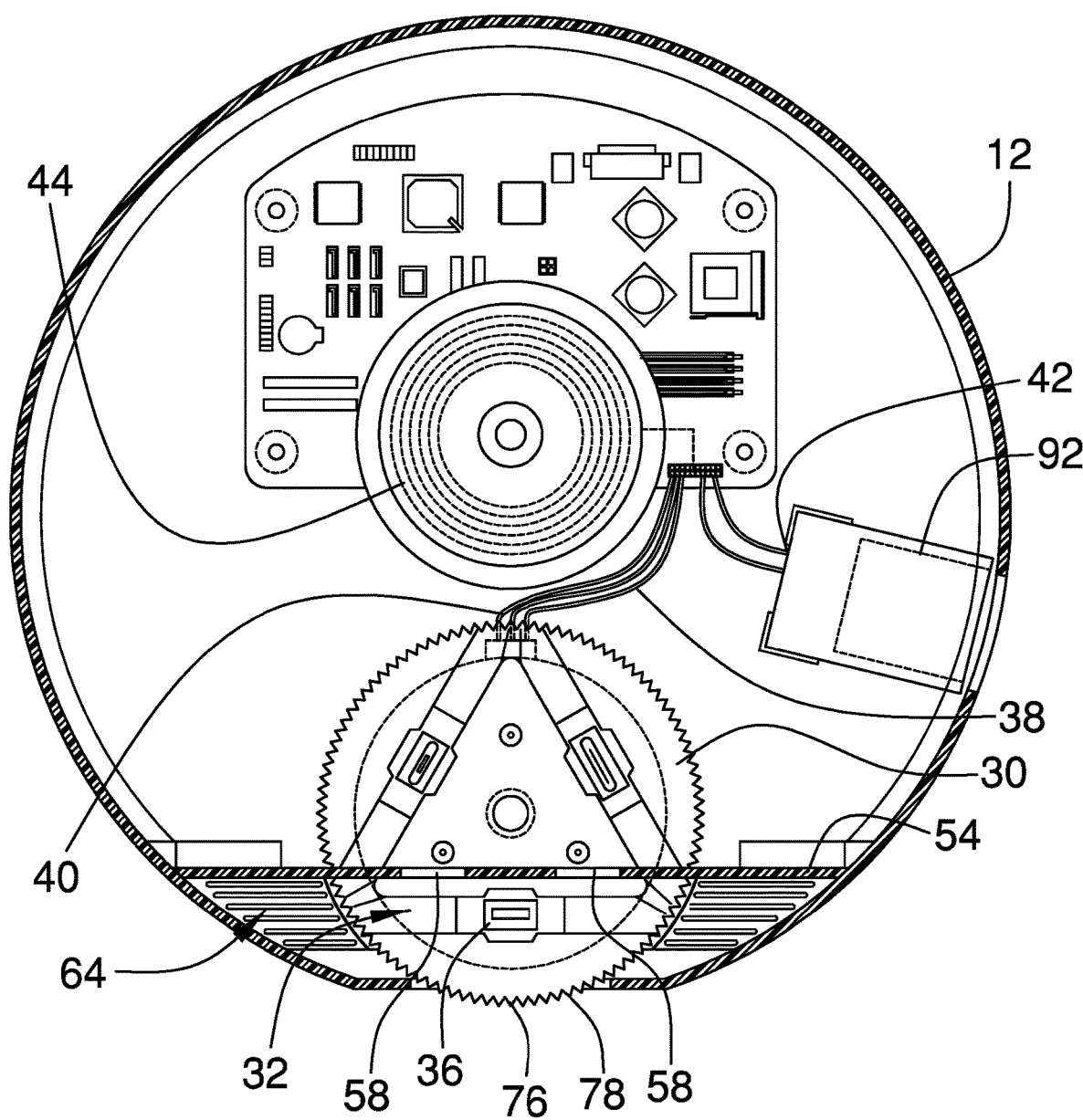
FIG. 6 is a cross-sectional view of an embodiment of the disclosure taken along line 6-6 of FIG. 5.

With reference now to the drawings, and in particular to FIGS. 1 through 9 thereof, a new electronics charging device embodying the principles and concepts of an embodiment of the disclosure and generally designated by the reference numeral 10 will be described.

As best illustrated in FIGS. 1 through 9, the multiple connector electronics docking device 10 generally comprises a housing 12 configured for positioning on a support surface. In an embodiment shown in FIGS. 1 through 4, a lamp 14 is coupled to and extends upwardly from the housing 12. The lamp 14 has a first section 16 having a bottom end 18 coupled to the housing 12. The first section 16 may be pivotally and rotatably coupled to the housing to allow for adjustable positioning of the first section 16 relative to the housing 12. The bottom end 18 is coupled to a top surface 20 of the housing 12 between an edge 22 of the top surface 20 and a middle of the top surface 20 such that a flat portion 24 of the top surface 20 is exposed to allow space for positioning of a conventional cellular or smart phone on the top surface 20 of the housing. The lamp 14 has a second section 26 pivotally coupled to a distal end 28 of the first section 16. The lamp 14 may provide a light emitting diode 34 on positioned on the second section 26. A display 86 is positioned on the first section 16. A motion detector 88 is positioned on the first section and operationally coupled to the light emitting diode 34 to activate the lamp upon motion being detected. A plurality of controls 90 are also provided and operationally coupled to the motion detector 88 and the light emitting diode 34 to selectively control operation of the motion detector 88 and the light emitting diode 34 by manipulation of the controls 90. Counter balance weights 92 may be provided in the housing 12 to keep the housing 12 stable on the support surface when the first section 16 and second section 26 are adjusted to extend laterally from the housing 12.

In the embodiments shown in FIGS. 1 through 7, a disc 30 is coupled to the housing 12. The disc 30 is rotatable relative to the housing 12 to expose a selectable portion 32 of the disc 30 outside of or on/flush with the housing 12. Each of a plurality of base connectors 36 is coupled to the disc 30. The base connectors 36 are spaced on the disc 30 such that a selectable one of the base connectors 36 is positionable to be exposed outside of the housing 12. Each base connector 36 is designed for connection to an associated connection type unique with respect to each other base connector 36. These may include connections for specific brands having proprietary connection structures and/or universal connection types which may be found on conventional electronic devices. The base connectors 36 may include a micro USB connector 36A, a type-C USB connector 36B, and an eight pin lightning plug connector 36C. The selectable portion 32 of the disc 30 is an upper face 74 of the disc 30. A portion 76 of a perimeter edge 78 of the disc 30 is exposed outside of the housing 12. Thus, the disc is configured to be rotatable relative to the housing 12 by manipulation of the portion 76 of the perimeter edge 78 to expose the selectable portion 32 of the upper face 74 of the disc 30 on the housing 12. The perimeter edge 78 has a plurality of indentations 80 such that the perimeter edge 78 is configured for enhancing frictional engagement with the perimeter edge 78 to facilitate manipulation of the disc 30.

A wire 38 has a first end 40 and a second end 42. The first end 40 is coupled to the disc 30 such that each base connector 36 is electrically coupled to the wire 38. This connection may be achieved in a conventional or known manner. The second end 42 of the wire 38 is coupled to the housing 12 such that the second end 42 is configured for being electrically coupled to a power source. The second end 42 may be used with a conventional power port 92 or power connection such as a universal serial bus connector or the like.

An induction coil 44 may be positioned within the housing 12 wherein the induction coil 44 is configured for wirelessly charging a device, such as a smart phone, positioned sufficiently near or on the housing 12 to achieve wireless charging in a conventional manner.

A speaker 48 is coupled to the housing 12. A wireless receiver 50 is operationally coupled to the speaker 48 wherein the speaker 48 is configured for transmitting sound originating from an extrinsic device, such as a smart phone or the like, through a wireless connection to the speaker 48. The wireless connection may employ a wireless personal access network established with a processor or the like operationally coupled to the wireless receiver 50 within the housing 12. The operational controls 90 are shown in an alternative position on the housing 12 and including controls for the speaker 48 and wireless receiver 50.

The housing 12 has a shelf portion 52. The selectable exposed portion 32 of the disc 30 is exposed on the shelf portion 52 of the housing 12. Adjacent to the shelf portion 52 is a backing wall 54 extending upwardly from an inner edge 56 of the shelf portion 52. A pair of parallel spaced slits 58 is positioned in spaced relationship and extending through the backing wall 54. The base connectors 36 pass through the slits 58 when the disc 30 is rotated relative to the housing 12 to allow for positioning of a single one of the base connectors 36 to be exposed outside of the housing 12.

A guard 60 is coupled to and extends upwardly from the shelf portion 52. The guard 60 extends over the selectable exposed portion 32 of the disc 30 on the shelf portion 52. The guard 60 is spaced from the backing wall 54 defining a slot 64 between the guard 60 and the backing wall 52. Each of the base connectors 36 is positionable in the slot 64 by rotation of the disc 30. The guard 60 extends over and separates the selectable exposed portion 32 of the upper face 74 of the disc 30 and the portion 76 of the perimeter edge 78 of the disc 30. The portion 76 of the perimeter edge 78 extends outwardly from the housing 12 and the guard 60 to facilitate engagement and manipulation of the disc 30.

Figure 7:
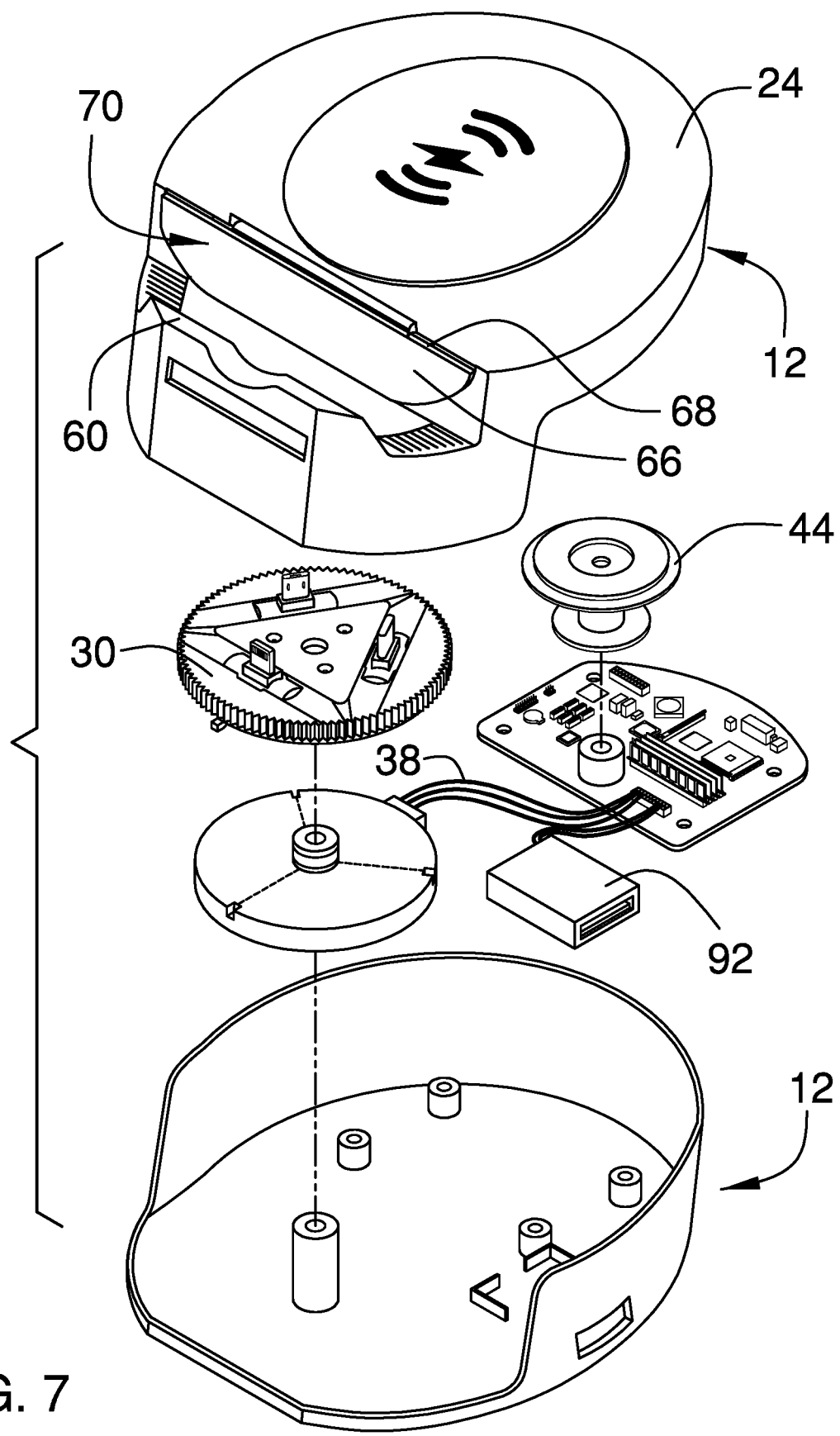
FIG. 7 is an exploded top front side perspective view of an embodiment of the disclosure.
Figure 8:
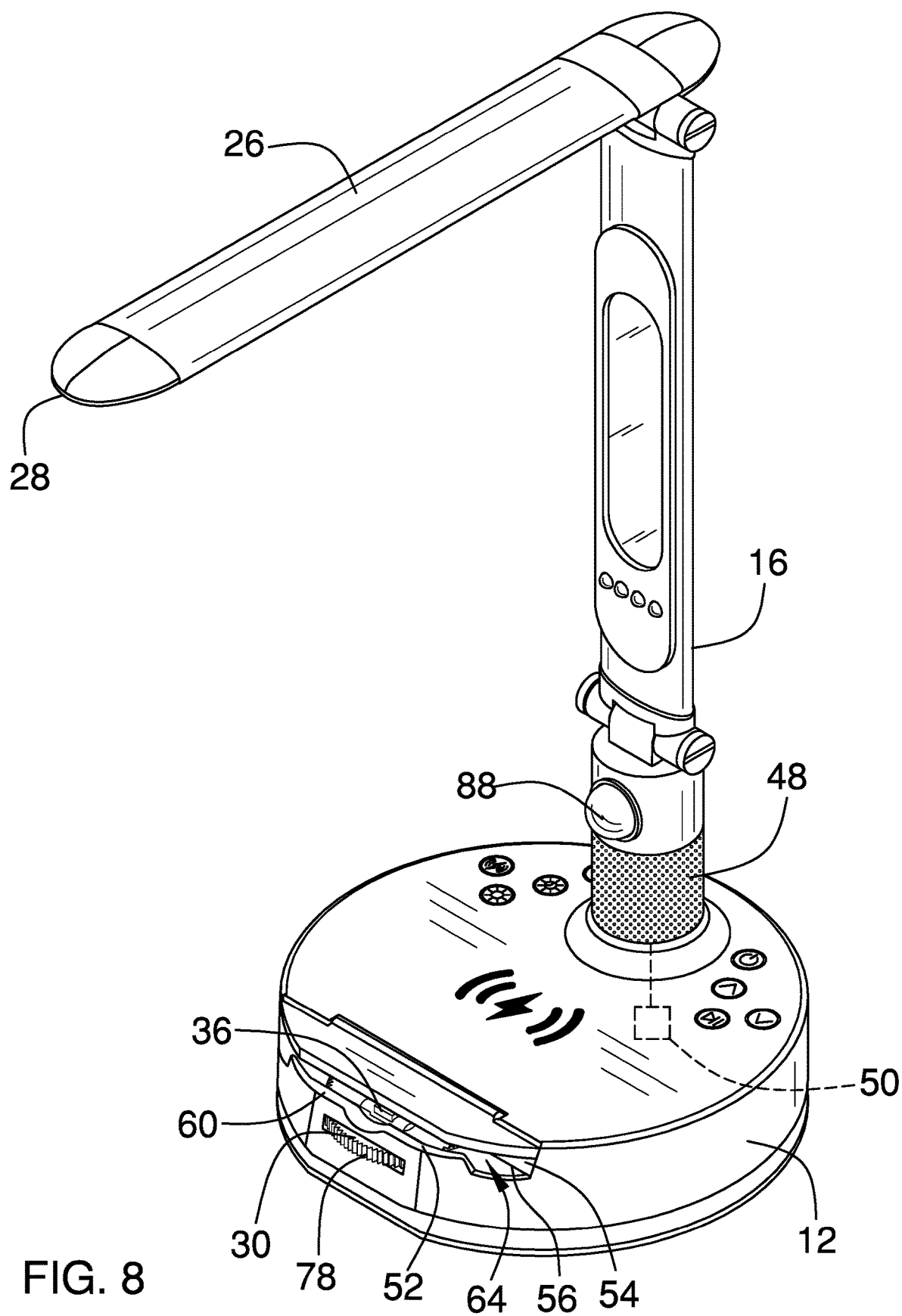
FIG. 8 is s top front side perspective view of an embodiment of the disclosure having a speaker.
Figure 9:
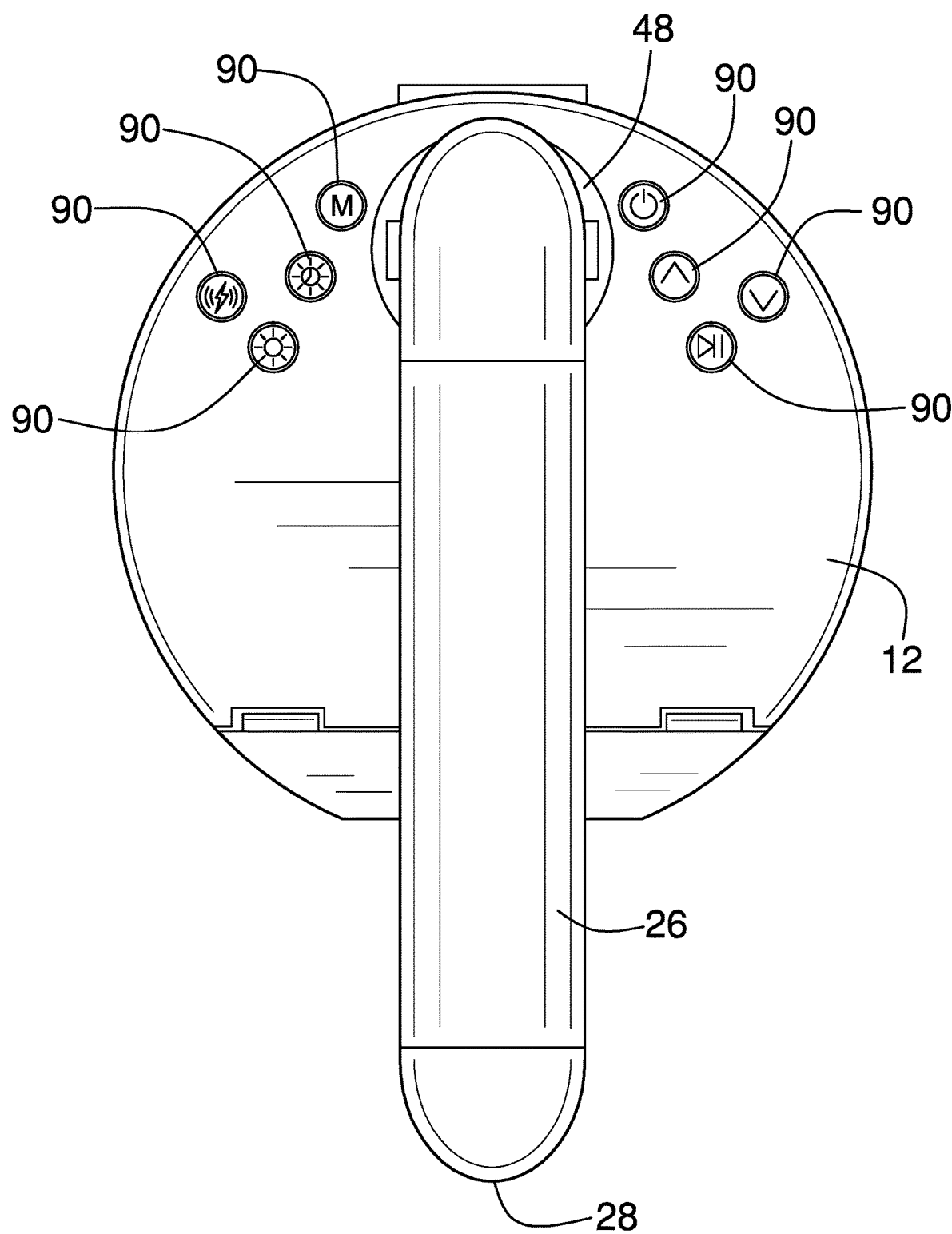
FIG. 9 is a top view of an embodiment of the disclosure having a speaker.

A cover 66 has a top edge 68 pivotally coupled to the housing 12 such that the cover 66 is pivotable between a closed position 70 to extend over the backing wall 52 such that the cover 66 covers the pair of slits 58, as seen in FIG. 7, and an open position 72 wherein the pair of slits 58 is exposed.

In use, the housing 12 is positioned on a support surface. The perimeter edge 78 is manipulated to position the desired base connector 36 to be exposed relative to the housing 12. An electronic device is connected to the exposed base connector 36 such that the electronic device is charged.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A multiple connector electronics docking device comprising:
  a housing configured for positioning on a support surface, said housing having a shelf portion, said housing having a backing wall extending upwardly from an inner edge of said shelf portion;
  a disc coupled to said housing such that said disc is rotatable relative to said housing, a portion of an upper face of said disc being exposed on said housing, a portion of a perimeter edge of said disc being exposed outside of said housing wherein said disc is configured to be rotatable relative to said housing by manipulation of said portion of said perimeter edge to expose a selectable portion of said upper face of said disc on said housing said portion of said disc being exposed on said shelf portion;
  a plurality of base connectors coupled to said disc, said base connectors being spaced on said disc such that a selectable one of said base connectors is positionable to be exposed outside of said housing;

a wire having a first end and a second end, said first end being coupled to said disc such that each said base connector is electrically coupled to said wire, said second end of said wire being coupled to said housing such that said second end is configured for being electrically coupled to a power source; and a pair of parallel spaced slits positioned in spaced relationship and extending through said backing wall, said base connectors passing through said slits when said disc is rotated relative to said housing.

2. The device of claim 1, further comprising said perimeter edge having a plurality of indentations wherein said perimeter edge is configured for frictional engagement to facilitate manipulation of said disc.

3. The device of claim 1, further comprising a lamp coupled to and extending from said housing.

4. The device of claim 3, further comprising said lamp including a light emitting diode.

5. The device of claim 1, further comprising an induction coil positioned within said housing wherein said induction coil is configured for wirelessly charging a device positioned on said housing.

6. The device of claim 1, further comprising a speaker coupled to said housing.

7. The device of claim 6, further comprising a wireless receiver operationally coupled to said speaker wherein said speaker is configured for transmitting sound originating from an extrinsic device through a wireless connection to said speaker.

8. The device of claim 1, further comprising a guard coupled to and extending upwardly from said shelf portion, said guard extending over said portion of said disc being exposed on said shelf portion, said guard being spaced from said backing wall defining a slot therebetween, each of said base connectors being positionable in said slot by rotation of said disc.

9. The device of claim 1, further comprising a cover, said cover having a top edge pivotally coupled to said housing such that said cover is pivotable between a closed position to extend over said backing wall such that said cover covers said pair of slits and an open position wherein said pair of slits is exposed.

10. A multiple connector electronics docking base device comprising:

a housing configured for positioning on a support surface, said housing having a shelf portion, said housing having a backing wall extending upwardly from an inner edge of said shelf portion;

a lamp coupled to and extending upwardly from said housing;

a disc coupled to said housing, said disc being rotatable relative to said housing to expose a selectable portion of said disc outside of said housing, said portion of said disc being exposed on said shelf portion;

a plurality of base connectors coupled to said disc, said base connectors being spaced on said disc such that a selectable one of said base connectors is positionable to be exposed outside of said housing;

a wire having a first end and a second end, said first end being coupled to said disc such that each said base connector is electrically coupled to said wire, said second end of said wire being coupled to said housing such that said second end is configured for being electrically coupled to a power source; and a pair of parallel spaced slits positioned in spaced relationship and extending through said backing wall, said base connectors passing through said slits when said disc is rotated relative to said housing.

11. The device of claim 10, further comprising said lamp including a light emitting diode.

12. The device of claim 10, further comprising an induction coil positioned within said housing wherein said induction coil is configured for wirelessly charging a device positioned on said housing.

13. The device of claim 10, further comprising:

a speaker coupled to said housing; and a wireless receiver operationally coupled to said speaker wherein said speaker is configured for transmitting sound originating from an extrinsic device through a wireless connection to said speaker.

14. The device of claim 10, further comprising a guard coupled to and extending upwardly from said shelf portion, said guard extending over said portion of said disc being exposed on said shelf portion, said guard being spaced from said backing wall defining a slot therebetween, each of said base connectors being positionable in said slot by rotation of said disc.

15. The device of claim 10, further comprising a cover, said cover having a top edge pivotally coupled to said housing such that said cover is pivotable between a closed position to extend over said backing wall such that said cover covers said pair of slits and an open position wherein said pair of slits is exposed.

16. A multiple connector electronics docking device comprising:

a housing configured for positioning on a support surface, said housing having a shelf portion, said housing having a backing wall extending upwardly from an inner edge of said shelf portion;

a disc coupled to said housing such that said disc is rotatable relative to said housing, a portion of an upper face of said disc being exposed on said housing, said portion of said disc being exposed on said shelf portion, a portion of a perimeter edge of said disc being exposed outside of said housing wherein said disc is configured to be rotatable relative to said housing by manipulation of said portion of said perimeter edge to expose a selectable portion of said upper face of said disc on said housing, said perimeter edge having a plurality of indentations wherein said perimeter edge is configured for frictional engagement to facilitate manipulation of said disc;

a plurality of base connectors coupled to said disc, said base connectors being spaced on said disc such that a selectable one of said base connectors is positionable to be exposed outside of said housing;

a wire having a first end and a second end, said first end being coupled to said disc such that each said base connector is electrically coupled to said wire, said second end of said wire being coupled to said housing such that said second end is configured for being electrically coupled to a power source;

a lamp coupled to and extending from said housing, said lamp including a light emitting diode;

an induction coil positioned within said housing wherein said induction coil is configured for wirelessly charging a device positioned on said housing;

a speaker coupled to said housing;

a wireless receiver operationally coupled to said speaker wherein said speaker is configured for transmitting sound originating from an extrinsic device through a wireless connection to said speaker;

a pair of parallel spaced slits positioned in spaced relationship and extending through said backing wall, said base connectors passing through said slits when said disc is rotated relative to said housing;

a guard coupled to and extending upwardly from said shelf portion, said guard extending over said portion of said disc being exposed on said shelf portion, said guard being spaced from said backing wall defining a slot therebetween, each of said base connectors being positionable in said slot by rotation of said disc; and a cover, said cover having a top edge pivotally coupled to said housing such that said cover is pivotable between a closed position to extend over said backing wall such that said cover covers said pair of slits and an open position wherein said pair of slits is exposed.

* * * * *